(12) United States Patent
Kawasumi

(10) Patent No.: US 6,415,007 B1
(45) Date of Patent: Jul. 2, 2002

(54) CHARGE PUMP HAVING TWO SUB CHARGE PUMPS WHICH INCLUDE A COMMON CHARGE/DISCHARGE TERMINAL

(75) Inventor: Atsushi Kawasumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/163,084

(22) Filed: Sep. 29, 1998

(30) Foreign Application Priority Data

Sep. 30, 1997 (JP) ............................................. 9-267345
Sep. 25, 1998 (JP) ........................................... 10-271155

(51) Int. Cl.[7] ............................................. H03L 7/089
(52) U.S. Cl. ...................... 375/374; 375/376; 327/148; 327/157
(58) Field of Search ................................ 375/374, 376; 327/147, 148, 156, 157

(56) References Cited

U.S. PATENT DOCUMENTS

| | | | | |
|---|---|---|---|---|
| 5,577,086 A | * | 11/1996 | Fujimoto et al. ............ | 375/376 |
| 5,703,511 A | * | 12/1997 | Okamoto ..................... | 327/157 |
| 5,825,640 A | * | 10/1998 | Quigley et al. ............... | 363/60 |
| 5,831,484 A | * | 11/1998 | Lukes et al. .................. | 331/17 |
| 5,886,551 A | * | 3/1999 | Narahara ..................... | 327/157 |
| 5,912,575 A | * | 6/1999 | Takikawa .................... | 327/157 |
| 5,933,031 A | * | 8/1999 | Konno .......................... | 327/7 |
| 6,107,849 A | * | 8/2000 | Williams et al. ............. | 327/157 |
| 6,130,565 A | * | 10/2000 | Nagano et al. .............. | 327/157 |
| 6,160,432 A | * | 12/2000 | Rhee et al. .................. | 327/157 |

OTHER PUBLICATIONS

Miyashita et al., "5MHz Analog-to-Digital Converter With Polarity Alternating Feedback Comparator", IEEE, pp. 91–94, 1997.*

Miyashita et al., "5MHz Analog-to-Digital Converter With Polarity Alternating Feedback Comparator", IEEE, pp. 91–94, Dec. 1997.*

Jeong, Deog-Kyoon, Gaetano Borriello, David A. Hodges and Randy H. Katz, "Design of PLL–Based Clock Generation Circuits," *IEEE Journal of Solid–State Circuits.*, vol. SC–22, No. 2, pp255–261, Apr. 1987.

* cited by examiner

Primary Examiner—Young T. Tse
(74) Attorney, Agent, or Firm—Hogan & Hartson, L.L.P.

(57) ABSTRACT

A charge pump according to the invention has first and second sub charge pumps which include a common charging/discharging terminal and perform charging/discharging operations. When the first sub charge pump is operated, and electricity to be offset is charged or discharged due to a junction capacitor located at a PN junction which exists between transistors included in the first sub charge pump, the second sub charge pump performs a discharging operation if the electricity is charged, and a charging operation if it is discharged, in order to offset the electricity. Moreover, while the first sub charge pump performs a charging operation, the second sub charge pump performs a charging operation for a time period shorter by a predetermined time period than the charging period of the first sub charge pump. On the other hand, while the first sub charge pump performs a discharging operation, the second sub charge pump performs a discharging operation for a time period shorter by a predetermined time period than the discharging period of the first sub charge pump.

13 Claims, 7 Drawing Sheets

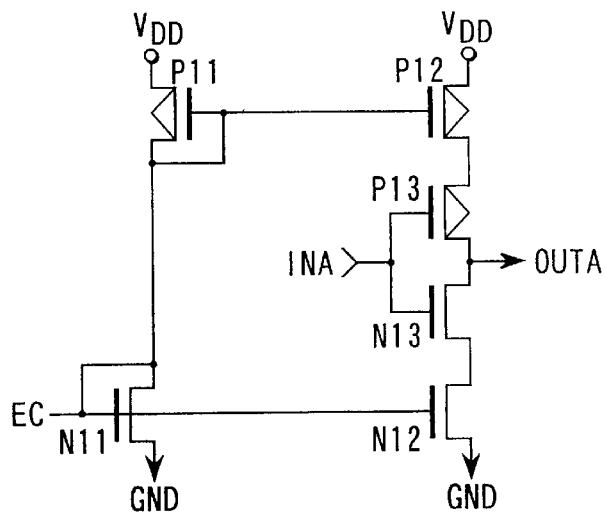
FIG. 16
FIG. 17
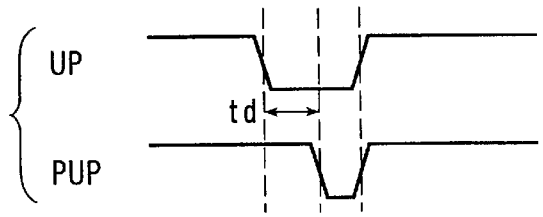
FIG. 18
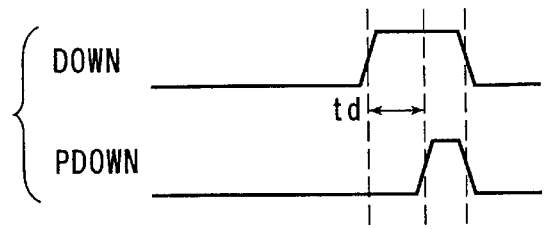
FIG. 19

CHARGE PUMP HAVING TWO SUB CHARGE PUMPS WHICH INCLUDE A COMMON CHARGE/DISCHARGE TERMINAL

BACKGROUND OF THE INVENTION

The present invention relates to a charge pump, and more particularly to a charge pump for use in a PLL (Phase Locked Loop).

The PLL has recently been mounted not only in microprocessors but also in high-speed memories, and is considered more and more important. For particulars of the PLL, see, for example, Deog-Kyoon Jeong et al., "Design of PLL-Based Clock Generation Circuit" IEEE Journal of Solid-State Circuits, Vol. SC-22, No. 2, pp. 255–261, April 1987.

The PLL generally has a charge pump, which will be described.

FIG. 1 is a circuit diagram, showing an example of a charge pump. This charge pump operates as below, supposing that a low pass filter (LPF) is connected to the charging terminal of the charge pump.

A p-channel MOS transistor (hereinafter referred to simply as a "pMOS transistor") P100 is driven by a charge signal as shown in FIG. 2. Then, the charge pump charges the LPF with electricity corresponding to the pulse width of the charge signal. Further, an n-channel MOS transistor (hereinafter referred to simply as an "nMOS transistor") N100 is driven by a discharge signal as shown in FIG. 2. Then, the charge pump discharges, from the LPF, electricity corresponding to the pulse width of the discharge signal.

The relationship between the total charge and the pulse width is controlled depending upon the sizes of current-limiting transistors P102 and N102 which are located at the source-sides of the pMOS transistor P100 and the nMOS transistor N100, or upon the input gate voltage (Vref).

Moreover, an nMOS transistor N104 and a pMOS transistor P104 are controlled by an enable signal and an enable bar signal which is the inverted signal of the enable signal, respectively. The nMOS transistor N104 and the pMOS transistor P104 serve as filters for interrupting a pass current when the charge pump is in a standby state, and removing switching noise while the charge pump operates.

As is shown in FIG. 1, there exist PN junctions at the drain-sides of the limiter transistors P102 and N102 of the charge pump, and junction capacitors C102 and C104 exist at the PN junctions. Accordingly, at the start of the charge pump, the current-limiting transistor P102 or N102 operates for the first time after the junction capacitor C102 or C104 is charged or discharged. This being so, electricity discharged from the junction capacitor C102 or that to be accumulated into the junction capacitor C104 (the electricity will be referred to as a "to-be-offset (or offset) charge") is added to electricity to be accumulated into or discharged from the low pass filter.

The offset charges will be described in detail. A case where charging is performed at the pMOS transistor side of the charge pump will be examined. If no junction capacitor C102 exists, the potential of the junction between the limiter transistor P102 and pMOS transistor P100 becomes less than a power voltage VDD and reaches the operation voltage of the limiter transistor P102 at the moment the charge signal level has changed to "L (Low)". The current which flows when the operation voltage has been reached is an ideal average current.

On the other hand, where there exists the junction capacitor C102 at the junction between the limiter transistor P102 and the pMOS transistor P100 as shown in FIG. 1, the potential of the junction has a value between the power voltage VDD and an operation voltage V1 until electricity flows from the junction capacitor C102 to the LPF via the pMOS transistor P100, even if the charge signal has shifted to "L", as is shown in FIG. 3. At this time, even if the pMOS transistor P100 operates in the pentode area, a current which includes an overshooting portion as shown in FIG. 3 and hence is greater than the ideal average current flows into the LPF. This extra current is the cause of the offset, and the hatched overshooting portion in FIG. 3 corresponds to the offset current.

When the pulse width of each of the discharge and charge signals is sufficiently large, the effective average current (=(total charge)/(pulse width)) is kept substantially constant even if a slight current is discharged from the junction capacitor C102 or charged into the junction capacitor C104. However, where the pulse width is small, only a slight offset current will increase the effective average current. An increase in the effective average current requires an increase in the capacity of the LPF in order to keep the entire PLL system stable, which will inevitably increase the lockup time or layout area.

BRIEF SUMMARY OF THE INVENTION

It is the object of the invention to provide a charge pump which is substantially free from the influence, upon a total charge, of a junction capacitor existing at a PN junction, even if the pulse width of a driving signal used in the pump is small, and hence in which pump the effective average current shows only a little dependency upon the pulse width during the charging or discharging operation of the pump.

According to a first aspect of the invention, there is provided a charge pump comprising: a first sub charge pump having a plurality of transistors for performing charging and discharging operations; and a second sub charge pump having a charging/discharging terminal common to that of the first sub charge pump, the second sub charge pump discharging electricity which is charged via the charging/discharging terminal when the first sub charge pump has performed a charging operation using electricity accumulated in a junction capacitor at a PN junction which exists between the transistors of the first sub charge pump, the second sub charge pump charging electricity via the charging/discharging terminal when the first sub charge pump has performed a discharging operation to charge the junction capacitor.

The charge pump constructed as above can substantially cancel electricity which is discharged from the junction capacitor existing at the PN junction, and is used as a charging current at the time of charging, and also can substantially cancel electricity which is accumulated in the junction capacitor and used as a discharging current at the time of discharging. As a result, even if the pulse width of a driving signal is small, the influence of the junction capacitor upon the total charge can be minimized, thereby suppressing an increase in average current when the charge pump performs charging and discharging operations, and reducing the dependency of the effective average current upon the pulse width.

According to a second aspect of the invention, there is provided a charge pump comprising: a first sub charge pump having a plurality of transistors for performing charging and discharging operations; and a second sub charge pump having a charging/discharging terminal common to that of the first sub charge pump, the second sub charge pump performing a charging operation for a time period shorter by a predetermined time period than a charging time period for which the first sub charge pump performs a charging operation, the second sub charge pump performing a discharging operation for a time period shorter by a predetermined time period than a discharging time period for which the first sub charge pump performs a discharging operation.

In the charge pump constructed as above, the first sub charge pump performs a charging operation for the charging time period, and the second sub charge pump performs a charging operation for a time period shorter by a predetermined time period than the charging time period of the first charge pump. On the other hand, the first sub charge pump performs a discharging operation for the discharging time period, and the second sub charge pump performs a discharging operation for a time period shorter by a predetermined time period than the discharging time period of the first charge pump. As a result, variations in average current during charging and discharging of the charge pump can be minimized, thereby reducing the dependency of the effective average current upon the pulse width.

According to a third aspect of the invention, there is provided a charge pump comprising: a plurality of first sub charge pumps having a plurality of transistors for performing charging and discharging operations; and a plurality of second sub charge pumps having a charging/discharging terminal common to that of the first sub charge pumps, the second sub charge pumps discharging electricity which is charged via the charging/discharging terminal when the first sub charge pumps have performed a charging operation using electricity accumulated in junction capacitors at PN junctions which exist between the transistors of the first sub charge pumps, the second sub charge pumps charging electricity via the charging/discharging terminal when the first sub charge pumps have performed a discharging operation to charge the junction capacitors.

The charge pump constructed as above can substantially cancel electricity which is discharged from the junction capacitor existing at each PN junction, and is used as a charging current at the time of charging, and also can substantially cancel electricity which is accumulated in the junction capacitor and used as a discharging current at the time of discharging. As a result, even if the pulse width of a driving signal is small, the influence of the junction capacitor upon the total charge can be minimized, thereby suppressing an increase in average current when the charge pump performs charging and discharging operations, and reducing the dependency of the effective average current upon the pulse width.

According to a fourth aspect of the invention, there is provided a charge pump comprising: a plurality of first sub charge pumps having a plurality of transistors for performing charging and discharging operations; and a plurality of second sub charge pumps having a charging/discharging terminal common to that of the first sub charge pumps, the second sub charge pumps performing a charging operation for a time period shorter by a predetermined time period than a charging time period for which the first sub charge pumps perform a charging operation, the second sub charge pumps performing a discharging operation for a time period shorter by a predetermined time period than a discharging time period for which the first sub charge pumps perform a discharging operation.

In the charge pump constructed as above,:the first sub charge pumps perform a charging operation for the charging time period, and the second sub charge pumps perform a charging operation for a time period shorter by a predetermined time period than the charging time period of the first charge pumps. On the other hand, the first sub charge pumps perform a discharging operation for the discharging time period, and the second sub charge pumps perform a discharging operation for a time period shorter by a predetermined time period than the discharging time period of the first charge pumps. As a result, variations in average current during charging and discharging of the charge pump can be minimized, thereby reducing the dependency of the effective average current upon the pulse width.

According to a fifth aspect of the invention, there is provided a charge pump comprising: a first sub charge pump having a plurality of transistors for performing a charging operation in response to a charging signal and a discharging operation in response to a discharging signal; and a second sub charge pump having a charging/discharging terminal common to that of the first sub charge pump, the second sub charge pump performing a discharging operation in response to a pulse signal generated from the charging signal, when the first sub charge pump has performed a charging operation in response to the charging signal using electricity accumulated in a junction capacitor at a PN junction which exists between the transistors of the first sub charge pump, the second sub charge pump performing a charging operation in response to a pulse signal generated from the discharging signal, when the first sub charge pump has performed a discharging operation in response to the discharging signal to charge the junction capacitor.

The charge pump constructed as above can substantially cancel electricity which is discharged from the junction capacitor existing at the PN junction, and is used as a charging current at the time of charging, and also can substantially cancel electricity which is accumulated in the junction capacitor and used as a discharging current at the time of discharging. As a result, even if the pulse width of a driving signal is small, the influence of the junction capacitor upon the total charge can be minimized, thereby suppressing an increase in average current when the charge pump performs charging and discharging operations, and reducing the dependency of the effective average current upon the pulse width.

According to a sixth aspect of the invention, there is provided a charge pump comprising: a first sub charge pump having a plurality of transistors for performing a charging operation in response to a charging signal of a first pulse width, and performing a discharging operation in response to a discharging signal of a second pulse width; and a second sub charge pump having a charging/discharging terminal common to that of the first sub charge pump, the second sub charge pump performing a charging operation in response to a pulse signal of a third pulse width shorter by a predetermined width than the first pulse width when the first sub charge pump performs the charging operation in response to the charging signal of the first pulse width, the second sub charge pump performing a discharging operation in response to a pulse signal of a fourth pulse width shorter by a predetermined width than the second pulse width when the first sub charge pump performs the charging operation in response to the charging signal of the second pulse width.

In the charge pump constructed as above, the first sub charge pump performs a charging operation in response to the charging signal of the first pulse width, and the second sub charge pump performs a charging operation in response to the pulse signal of the third pulse width smaller by the predetermined width than the first pulse width. On the other hand, the first sub charge pump performs a discharging operation in response to the discharging signal of the second pulse width, and the second sub charge pump performs a discharging operation in response to the pulse signal of the fourth pulse width smaller by the predetermined width than the second pulse width. As a result, variations in average current during charging and discharging of the charge pump can be minimized, thereby reducing the dependency of the effective average current upon each pulse width.

According to a seventh aspect of the invention, there is provided a charge pump comprising: a first sub charge pump having a charging section wherein the source of a first p-channel MOS transistor is connected to the drain of a second p-channel MOS transistor, the drain of the first p-channel MOS transistor is connected to the source of a third p-channel MOS transistor, the source of the second p-channel MOS transistor is connected to a power voltage, and the drain of the third p-channel MOS transistor is connected to a charging/discharging terminal, the first sub charge pump also having a discharging section wherein the drain of a first n-channel MOS transistor is connected to the source of a second n-channel MOS transistor, the source of the first n-channel MOS transistor is connected to the drain of a third n-channel MOS transistor, the drain of the second n-channel MOS transistor is connected to a ground voltage, and the source of the third n-channel MOS transistor is connected to the charging/discharging terminal; and a second sub charge pump having a charging section wherein the source of a fourth p-channel MOS transistor is connected to the drain of a fifth p-channel MOS transistor, the drain of the fourth p-channel MOS transistor is connected to the source of a sixth p-channel MOS transistor, the source of the fifth p-channel MOS transistor is connected to the power voltage, and the drain of the sixth p-channel MOS transistor is connected to the charging/discharging terminal, the second sub charge pump also having a discharging section wherein the drain of a fourth n-channel MOS transistor is connected to the source of a fifth n-channel MOS transistor, the source of the fourth n-channel MOS transistor is connected to the drain of a sixth n-channel MOS transistor, the drain of the fifth n-channel MOS transistor is connected to the ground voltage, and the source of the sixth n-channel MOS transistor is connected to the charging/discharging terminal.

Even if the pulse width of a driving signal is small in the charge pump constructed as above, the influence of the junction capacitor upon the total charge can be minimized, thereby suppressing an increase in average current when the charge pump performs charging and discharging operations, and reducing the dependency of the effective average current upon the pulse width.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 16 is a circuit diagram, showing a VCO cell incorporated in the voltage controlled oscillator of FIG. 15;

FIG. 17 is a circuit diagram, showing a charge pump according to another embodiment of the invention;

FIG. 18 is a view, showing a driving waveform for charging the charge pump of FIG. 17;

FIG. 19 is a view, showing driving a waveform for discharging the charge pump of FIG. 17;

DETAILED DESCRIPTION OF THE INVENTION

A semiconductor storage device, a PLL formed in the device and a charge pump included in the PLL, according to the invention, will be described in this order with reference to the accompanying drawings.

Figure 1:
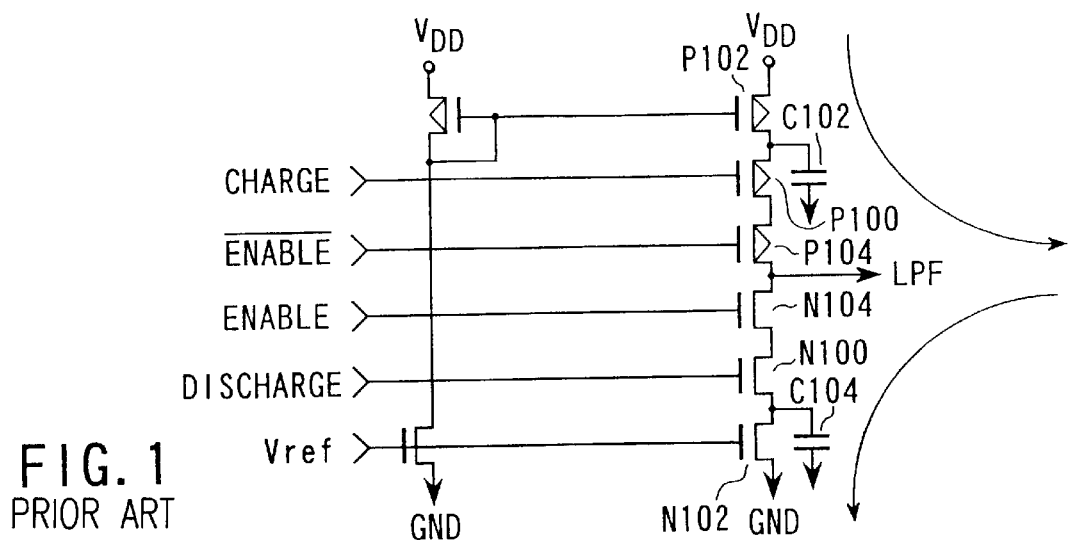
FIG. 1 is a circuit diagram, showing an example of a conventional charge pump.
Figure 2:
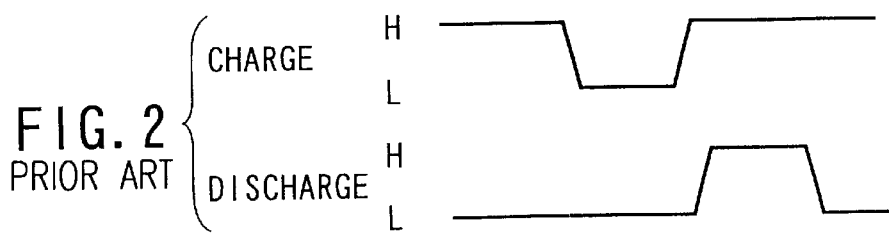
FIG. 2 is a view, showing driving waves for operating the charge pump of FIG. 1.
Figure 3:
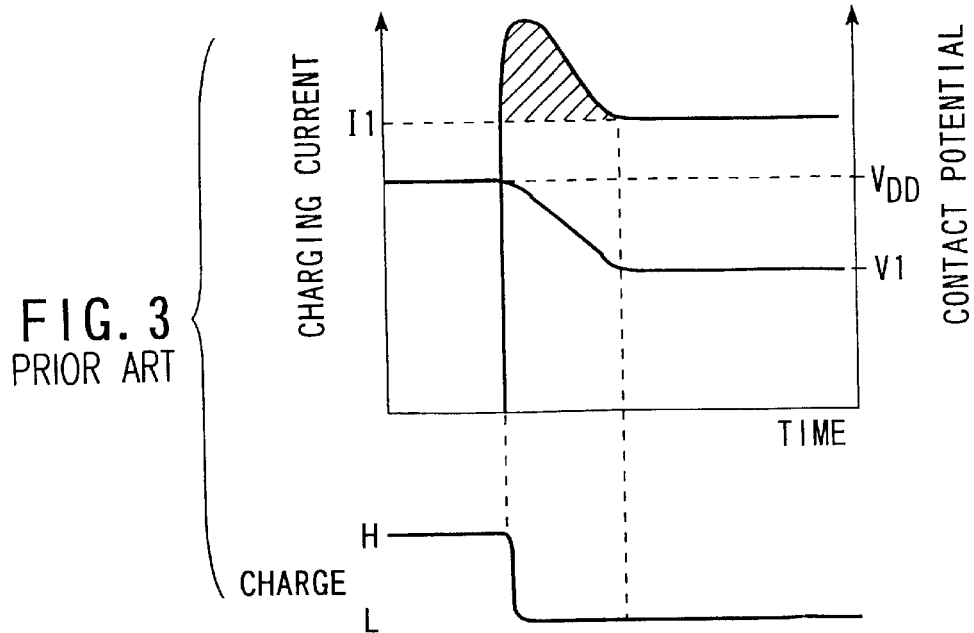
FIG. 3 is a graph, showing a charged current and a junction potential assumed while the charge pump of FIG. 1 is charged.
Figure 4:
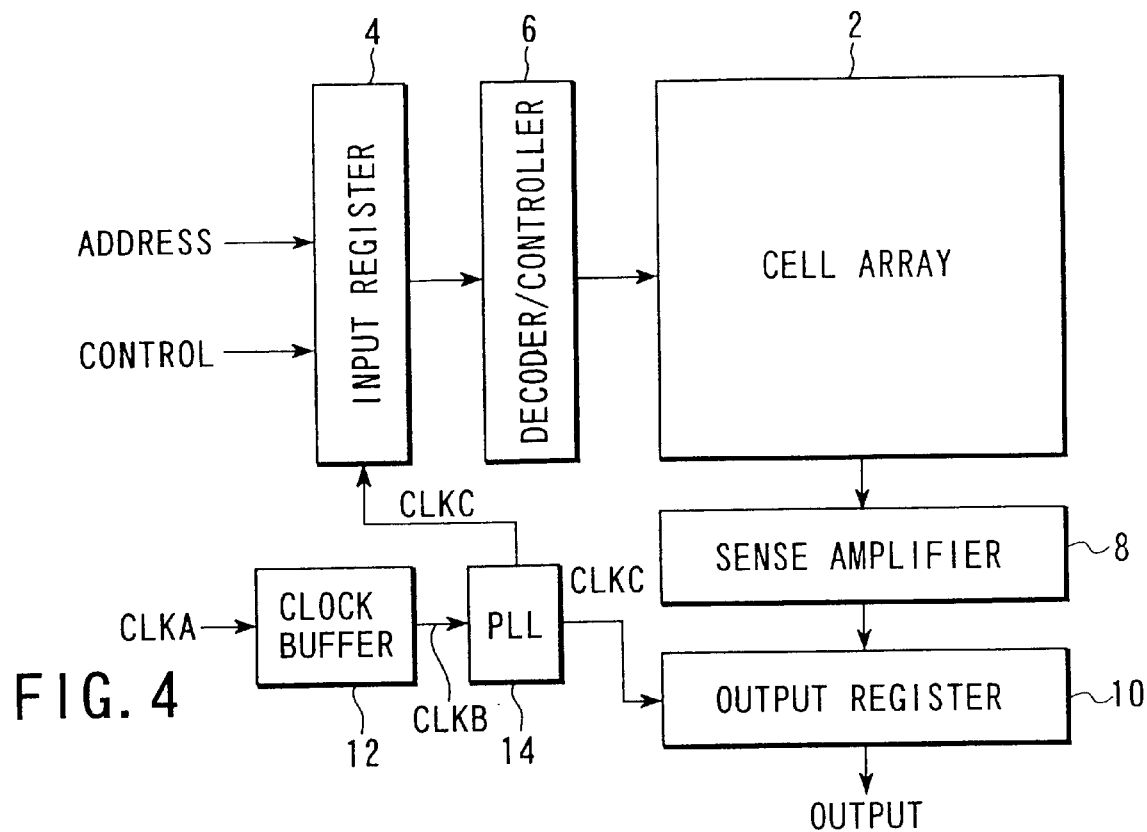
FIG. 4 is a block diagram, showing a semiconductor storage device according to an embodiment of the invention.

FIG. 4 is a block diagram, showing the semiconductor storage device.

As is shown, the semiconductor storage device has a cell array 2, an input register 4, a decoder/controller 6, a sense amplifier 8, an output register 10, a clock buffer 12 and a PLL 14.

The cell array 2 consists of arrayed memory cells for storing data. The input register 4 temporarily stores an address signal and a control signal, and output them in synchronism with a clock signal CLKC supplied from the PLL 14. The decoder/controller 6 receives the address signal and control signal from the input register 4 and selects a memory cell in the cell array 2 on the basis of the received signals. The sense amplifier 8 reads data from the selected memory cell. The output register 10 temporarily stores data read by the sense amplifier 8, and outputs it in synchronism with the clock signal CLKC supplied from the PLL 14.

The clock buffer 12 receives a clock signal CLKA supplied from the outside of the device, and serves a level shifter for shifting the voltage level of the clock signal CLKA, and also as a driver for supplying the synchronizing clock signal to the semiconductor storage device. The PLL 14 adjusts a clock signal CLKB supplied from the clock buffer 12 to eliminate a delay in the signal, and supplies the adjusted clock signal CLKC to the input register 4 and output register 10.

The above-described semiconductor storage device will operate as follows:

Address and control signals are input to the input register 4. These signals are output from the input register 4 to the decoder/controller 6 in synchronism with the clock signal CLKC supplied from the PLL 14. The decoder/controller 6 selects that memory cell in the cell array 2 on the basis of the received address and control signals, into or from which data is written or read. The data stored in the memory cell is read by the sense amplifier 8 and temporarily stored in the output register 10.

The clock signal CLKA input from the outside of the device is level-shifted so that its voltage level is adaptable in the semiconductor storage device, thereby creating the clock signal CLKB. At this time, the clock signal CLKB is delayed by the clock buffer 12.

The clock signal CLKB is input to the PLL 14. The PLL 14 in turn adjusts the phase of the clock signal CLKB delayed by the clock buffer 12, and then supplies the adjusted clock signal CLKC to the input and output registers 4 and 10. As aforementioned, the input register 4 outputs the address and control signals in synchronism with the received clock signal CLKC. The output register 10 outputs registered data in synchronism with the received clock signal CLKC.

As described above, in the semiconductor storage device, the clock signal CLKA input from the outside of the device is delayed by the clock buffer 12. This delay is, however, corrected by the PLL 14, whereby the timing-adjusted clock signal CLKC for synchronization is created. The clock signal CLKC is supplied to the input and output registers 4 and 10, and used as a synchronization clock signal for inputting and outputting data in the semiconductor storage device.

The PLL 14 formed in the semiconductor storage device will be described.

Figure 5:
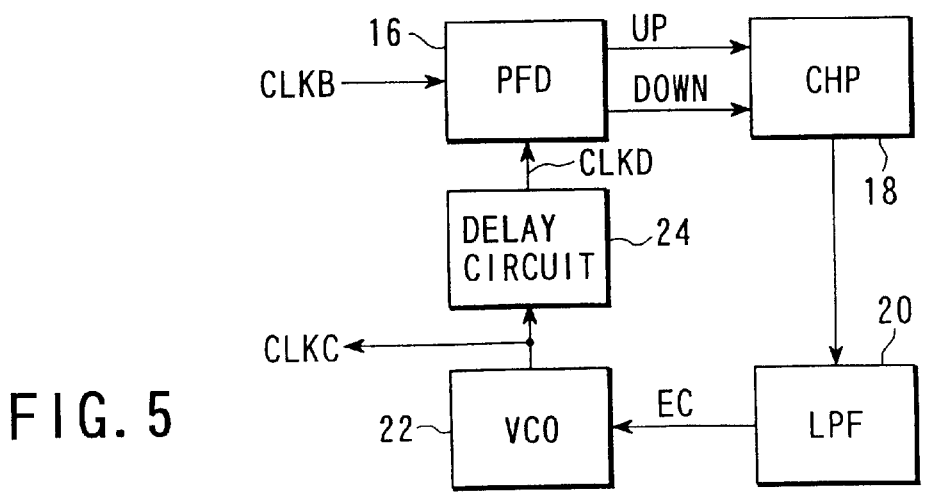
FIG. 5 is a block diagram, showing a PLL incorporated in the semiconductor storage device of FIG. 4.

FIG. 5 is a block diagram, showing the structure of the PLL 14 in the semiconductor storage device.

As is shown in FIG. 5, the PLL 14 includes a phase frequency detector (PFD) 16, a charge pump (CHP) 18, a low pass filter (LPF) 20, a voltage controlled oscillator (VCO) 22 and a delay circuit 24.

In the PLL 14, first, the phase frequency detector 16 compares the clock signal CLKB input from the clock buffer 12 with the clock signal CLKD delayed by the delay circuit 24. The phase frequency detector 16 outputs the following signals in accordance with the phase difference between the two clock signals CLKB and CLKD. When the phase of the clock signal CLKD retards with respect to that of the clock signal CLKB, the detector generates an UP signal for advancing the phase of the clock signal CLKD. On the other hand, when the phase of the clock signal CLKD advances with respect to that of the clock signal CLKB, the detector generates a DOWN signal for delaying the phase of the clock signal CLKD.

The charge pump 18 is charged with electricity in response to the UP signal, and discharged of it in response to the DOWN signal, thereby controlling the electricity accumulated in the low pass filter 20. The low pass filter 20 applies a control voltage EC corresponding to its accumulated electricity to the voltage controlled oscillator 22. The voltage controlled oscillator 22 supplies the delay circuit 24 with a clock signal CLKC of an oscillation frequency determined by the control voltage EC. The delay circuit 24 sets therein a delay time TA corresponding to the time by which the clock signal CLKA is delayed in the clock buffer 12. Accordingly, the delay circuit 24 supplies the phase frequency detector 16 with a clock signal CLKD obtained by delaying the clock signal CLKC by the time TA. Thus, the phase frequency detector 16 receives a clock signal CLKD obtained by delaying, by the delay time TA in the clock buffer 12, the clock signal CLKC which has its phase adjusted in accordance with the difference in phase between the two clock signals CLKB and CLKD.

Further, the phase frequency detector 16 again compares the phase-adjusted clock signal CLKD with the clock signal CLKB, thereby outputting the UP or DOWN signal. The charge pump 18, the low pass filter 20, the voltage controlled oscillator 22 and the delay circuit 24 repeat the above-described operation, thereby outputting the phase-adjusted clock signal CLKD to the phase frequency detector 16. As a result of the repeated operation, the clock signal CLKC becomes a clock signal having its phase advanced with respect to the clock signal CLKB by a time corresponding to the delay time TA of the clock buffer 12. As described above, the PLL 14 eliminates the delay in the clock signal CLKB delayed by the clock buffer 12, and generates a phase-adjusted clock signal CLKC.

Figure 6:
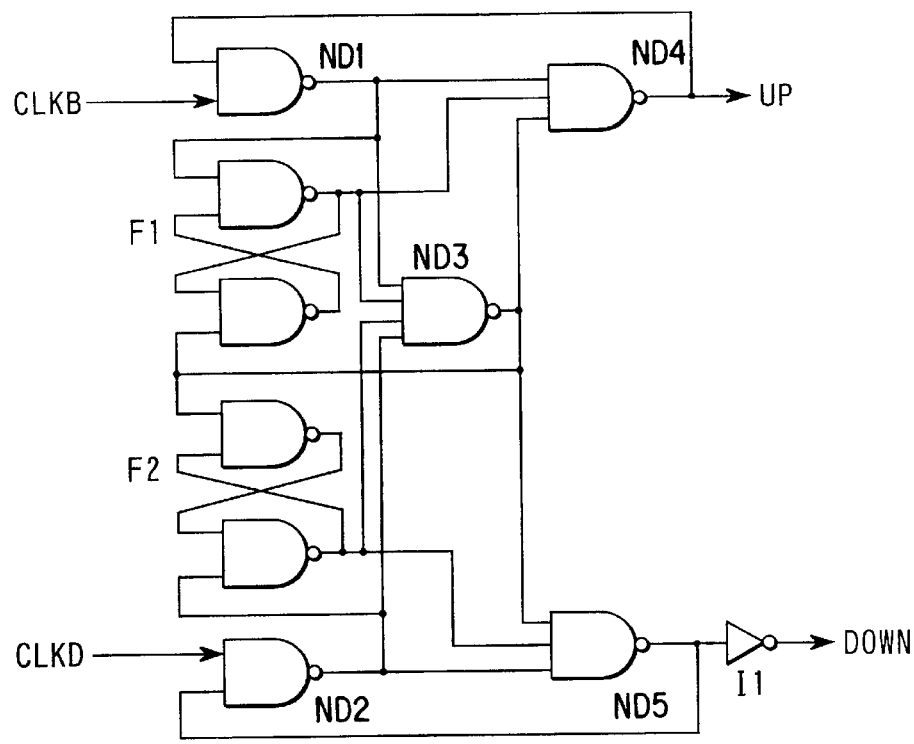
FIG. 6 is a circuit diagram, showing a phase frequency detector employed in the PLL of FIG. 5.
Figure 7:
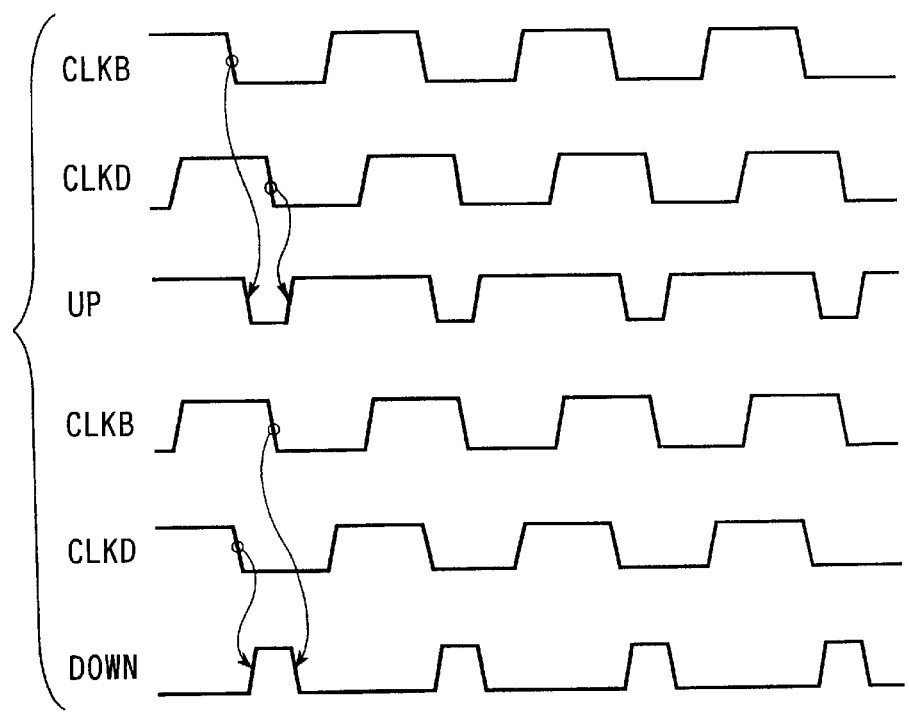
FIG. 7 is a timing chart, illustrating the input and output signals of the phase frequency detector of FIG. 6.

Referring then to FIGS. 6 and 7, the phase frequency detector (PFD) 16 incorporated in the PLL 14 of FIG. 5 will be described.

FIG. 6 is a circuit diagram, showing the structure of the phase frequency detector 16 in the PLL 14, and FIG. 7 a timing chart useful in explaining the input and output signals of the phase frequency detector 16.

As is shown in FIG. 6, the phase frequency detector 16 comprises flip-flops F1 and F2, NAND gate circuits ND1–ND5 and an inverter I1. The NAND gate circuit ND1 has its input terminal adapted to receive the clock signal CLKB, while the NAND gate circuit ND2 has its input terminal adapted to receive the clock signal CLKD. The NAND gate circuit ND4 has its output terminal adapted to output the UP signal, while the inverter I1 has its output terminal adapted to output the DOWN signal.

The phase frequency detector 16 compares the phase of the clock signal CLKB with that of the clock signal CLKD, and outputs the following signals depending upon the difference in phase between those signals: When the phase of the clock signal CLKD retards with respect to the phase of the clock signal CLKB as shown in FIG. 7, a pulse (UP signal) indicative of the difference between the trailing edges of the two clock signals is generated. When, on the other hand, the phase of the clock signal CLKD advances with respect to the phase of the clock signal CLKB, a pulse (DOWN signal) indicative of the difference between the trailing edges of the two clock signals is generated.

Figure 8:
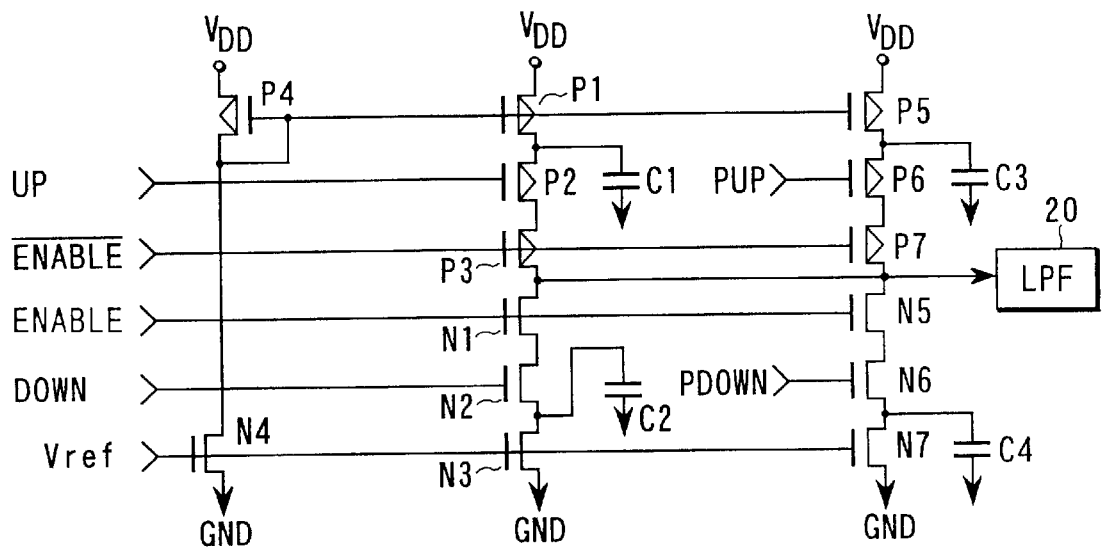
FIG. 8 is a circuit diagram, showing a charge pump incorporated in the PLL of FIG. 5.

Referring to FIG. 8, the charge pump 18 incorporated in the PLL of FIG. 5 will be described.

FIG. 8 is a circuit diagram, showing the structure of the charge pump 18 in the PLL 14.

This charge pump includes a first charge pump (hereinafter referred to as a "first sub charge pump") and a second charge pump (hereinafter referred to as a "second sub charge pump").

As is shown in FIG. 8, the first sub charge pump is constructed as below. A p-channel MOS transistor (hereinafter referred to as a "pMOS transistor") P1 has its source connected to a power voltage VDD, and its drain connected to the source of a pMOS transistor P2. The drain of the pMOS transistor P2 is connected to the source of a pMOS transistor P3, and the drain of the pMOS transistor P3 to a low pass filter (LPF) 20.

The drain of the pMOS transistor P3 is connected to the drain of an n-channel MOS transistor (hereinafter referred to as an "nMOS transistor") N1, and the source of the nMOS transistor N1 to the drain of an nMOS transistor N2. The source of the nMOS transistor N2 is connected to the drain of an nMOS transistor N3, and the source of the nMOS transistor N3 to a reference voltage source (GND).

Moreover, PN junctions exist between the drain of the pMOS transistor P1 and the source of the pMOS transistor P2, and between the source of the nMOS transistor N2 and the drain of the nMOS transistor N3, and junction capacitors C1 and C2 are formed at the PN junctions, respectively.

A pMOS transistor P4 has a source connected to the VDD, a gate connected to the gate of the pMOS transistor P1, and a drain connected to the drain of an nMOS transistor N4. The gate and drain of the pMOS transistor P4 are connected to each other, and the source of the nMOS transistor N4 to the reference voltage source.

In addition, an UP signal for controlling the charging operation of the charge pump is input to the gate of the pMOS transistor P2. An enable bar signal which is the inverted signal of an enable signal is input to the gate of the pMOS transistor P3. Furthermore, the enable signal is input to the gate of the nMOS transistor N1, a DOWN signal for controlling the discharging operation of the charge pump is input to the gate of the nMOS transistor N2, and a Vref signal is input to the gate of the nMOS transistor N3.

The second sub charge pump is constructed as below. A p-channel MOS transistor P5 has its source connected to the power voltage VDD, and its drain connected to the source of a pMOS transistor P6. The drain of the pMOS transistor P6 is connected to the source of a pMOS transistor P7, and the drain of the pMOS transistor P7 to a low pass filter (LPF) 20.

The drain of the pMOS transistor P7 is connected to the drain of an n-channel MOS transistor N5, and the source of the nMOS transistor N5 to the drain of an nMOS transistor N6. The source of the nMOS transistor N6 is connected to the drain of an nMOS transistor N7, and the source of the nMOS transistor N7 to the reference voltage source (GND).

Moreover, PN junctions exist between the drain of the pMOS transistor P5 and the source of the pMOS transistor P6, and between the source of the nMOS transistor N6 and the drain of the nMOS transistor N7, and junction capacitors C3 and C4 are formed at the PN junctions, respectively.

The gate of the pMOS transistor P5 is connected to the gate of the pMOS transistor P4. The UP signal for controlling the charging operation of the charge pump is input to the gate of the pMOS transistor P6. The enable bar signal which is the inverted signal of the enable signal is input to the gate of the pMOS transistor P7. Furthermore, the enable signal is input to the gate of the nMOS transistor N5, the PDOWN signal for controlling the discharging operation of the charge pump is input to the gate of the nMOS transistor N6, and the Vref signal is input to the gate of the nMOS transistor N7.

The operation of the above-described charge pump 18 will be described.

Figure 9:
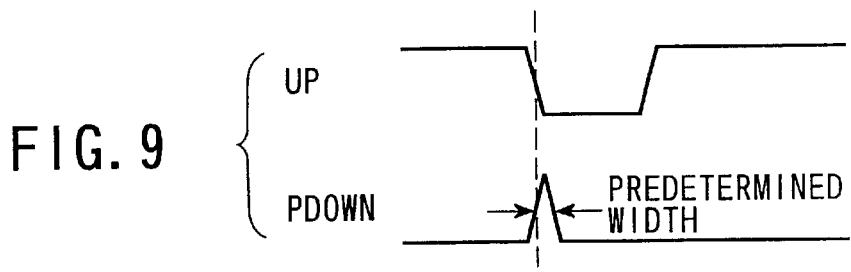
FIG. 9 is a view, showing driving a waveform for charging the charge pump of FIG. 8.
Figure 10:
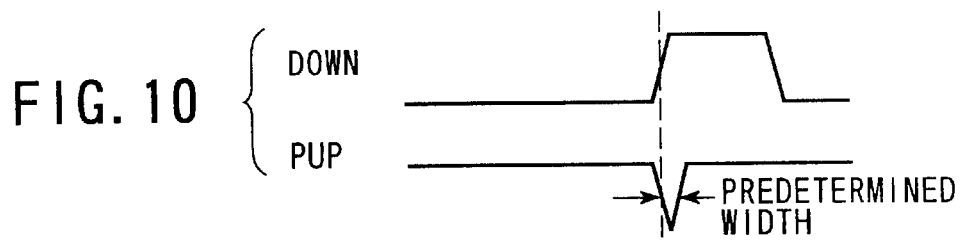
FIG. 10 is a view, showing driving a waveform for discharging the charge pump of FIG. 8.

In the first sub charge pump, the pMOS transistor P2 is driven and turned on by an UP signal as shown in FIG. 9. As a result, the first sub charge pump charges the low pass filter 20 with electricity corresponding to the pulse width of the UP signal. Further, in the first sub charge pump, the nMOS transistor N2 is driven and turned on by a DOWN signal as shown in FIG. 10. As a result, the first sub charge pump discharges, from the low pass filter 20, electricity corresponding to the pulse width of the DOWN signal.

The relationship between the total charge and the pulse widths is controlled by the size of the current limiting transistor P1 or N3 located at the source-side of the pMOS transistor P2 or the nMOS transistor N2, or by the gate voltage (Vref) applied to the limiter transistor N3 and the nMOS transistor N4.

Also, the output-side pMOS transistor P3 and nMOS transistor N1 are controlled by the enable bar signal and the enable signal, respectively, and serve as filters for interrupting a pass current while the charge pump is in the stand-by state, and eliminating switching noise while the charge pump operates.

On the other hand, in the second sub charge pump, at substantially the moment when the first sub charge pump is driven by the UP signal, the nMOS transistor N6 is driven and turned on by a PDOWN signal of a predetermined pulse width, as shown in FIG. 9, which uses the leading edge of the UP signal as a trigger. As a result, the sub charge pump discharges, from the low pass filter 20, electricity corresponding to the predetermined pulse width of the PDOWN signal.

In addition, in the second sub charge pump, at substantially the moment when the first sub charge pump is driven by the DOWN signal, the pMOS transistor P6 is driven and turned on by a PUP signal of a predetermined pulse width, as shown in FIG. 10, which uses the leading edge of the DOWN signal as a trigger. As a result, the sub charge pump charges the low pass filter 20 with electricity corresponding to the predetermined pulse width of the PUP signal.

In the second sub charge pump, the relationship between the total charge and the pulse widths is controlled by the size of the current limiting transistor P5 or N7 located at the source-side of the pMOS transistor P6 or the nMOS transistor N6, or by the gate voltage (Vref) applied to the limiter transistor N7 and the nMOS transistor N4.

Also, the output-side pMOS transistor P7 and nMOS transistor N5 are controlled by the enable bar signal and the enable signal, respectively, and serve as filters for interrupting a pass current while the charge pump is in the stand-by state, and eliminating switching noise while the charge pump operates.

The charge pump 18 constituted of the first and second sub charge pumps, which operate as described above, operates as below. When the charge pump 18 has started its charging operation, the potential of the drain of the limiter transistor P1 becomes its operable level after electricity accumulated in the junction capacitor C1 located on the drain-side of the limiter transistor P1 is discharged. On the other hand, when the charge pump 18 has started its discharging operation, the potential of the drain of the limiter transistor N3 becomes its operable level after the junction capacitor C2 located on the drain-side of the limiter transistor N3 is charged with electricity. Thus, the limiter transistor P1 or N3 is turned on to thereby limit the current. Accordingly, immediately after the start of the charging operation by the charge pump 18, the limiter transistor P1 does not work, and hence the electricity accumulated in the junction capacitor C1 is added to the electricity to be accumulated into the low pass filter 20. Moreover, immediately after the start of the discharging operation by the charge pump 18, the limiter transistor N3 does not work, and hence the electricity to be accumulated into the junction capacitor C2 is added to the electricity discharged from the low pass filter 20. The electricity accumulated in the junction capacitor C1 or the electricity to be accumulated into the junction capacitor C2 will hereinafter be referred to as an "offset charge".

The junction capacitor exists where a PN junction exists. Accordingly, in this charge pump 18, the predetermined pulse width of the PDOWN signal shown in FIG. 9 is set at a length (time length) which enables discharge of the offset charge, in order to eliminate the adverse influence of the offset charge during the charging operation of the pump. Similarly, to eliminate the adverse influence of the offset charge during the discharging operation of the pump, the predetermined pulse width of the PUP signal shown in FIG. 10 is set at a length (time length) which enables discharge of the offset charge. In other words, the predetermined pulse widths are set at values which are required to discharge and charge the junction capacitors C1 and C2, respectively.

In summary, when the charge pump 18 performs a charging operation, the first and second sub charge pumps are substantially simultaneously driven by the Up and PDOWN signals shown in FIG. 9. Then, electricity corresponding to the pulse width of the UP signal flows into the low pass filter (LPF) 20 in the. first sub charge pump, while electricity corresponding to the pulse width of the PDOWN signal is discharged from the low pass filter 20 in the second sub charge pump. As a result, the offset charge is discharged, which means that the offset charge extra flows into the filter 20 at the time of charging can be substantially canceled.

On the other hand, when the charge pump performs a discharging operation, the first and second sub charge pumps are substantially simultaneously driven by the DOWN and PUP signals shown in FIG. 10. Then, electricity corresponding to the pulse width of the DOWN signal is discharged from the low pass filter 20 in the first sub charge pump, while electricity corresponding to the pulse width of the PUP signal flows into the low pass filter 20 in the second sub charge pump. As a result, the offset charge flows into the filter 20, which means that the offset charge to be extra discharged from the low pass filter 20 at the time of discharging can be substantially canceled.

Figure 11:
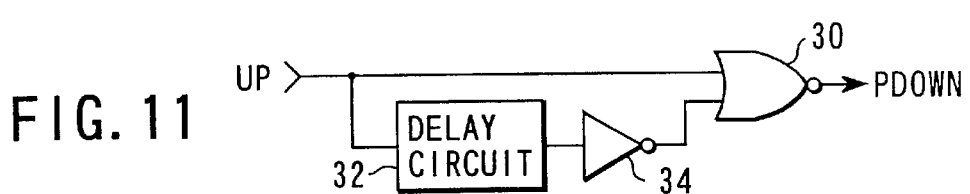
FIG. 11 is a circuit diagram, showing a circuit for generating the driving waveform of FIG. 9.

Further, a circuit as shown in FIG. 11 can be used as one for generating the PDOWN signal from the UP signal. In the FIG. 11 circuit, the UP signal is input to the first terminal of a NOR gate circuit 30. The UP signal is also delayed and inverted by a delay circuit 32 and an inverter 34, respectively, and then input to the second terminal of the NOR gate circuit 30. The NOR gate circuit 30 produces the alteration of the signals input to its first and second terminals, and inverts the alteration. Thus, the PDOWN signal shown in FIG. 9 is generated.

Figure 12:
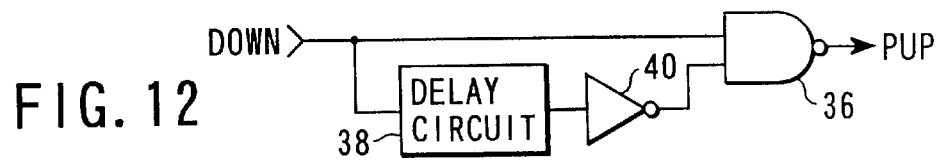
FIG. 12 is a circuit diagram, showing a circuit for generating the driving waveform of FIG. 10.

A circuit as shown in FIG. 12 is used as one for generating the PUP signal from the DOWN signal. In the FIG. 12 circuit, the DOWN signal is input to the first terminal of a NAND gate circuit 36. The DOWN signal is also delayed and inverted by a delay circuit 38 and an inverter 40, respectively, and then input to the second terminal of the NAND gate circuit 36. The NAND gate circuit 36 produces the logical product of the signals input to its first and second terminals, and inverts the logical product. Thus, the PUP signal shown in FIG. 10 is generated. At this time, the predetermined widths of the PDOWN and PUP signals are determined by delay times due to the delay circuits and the inverters.

Figure 13:
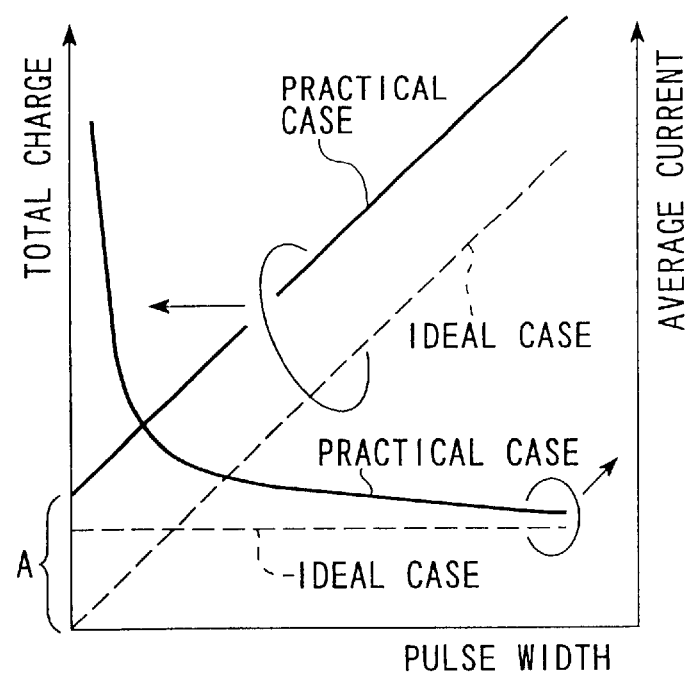
FIG. 13 is a graph, illustrating the relationship between the pulse width of a driving signal, a total charge and an average current in the charge pump of FIG. 8.

In the above-described charge pump 18 shown in FIG. 8, the relationship between each input pulse width and the total charge in the first sub charge pump can be expressed by the solid line (indicative of a practical case) in FIG. 13 which is obtained by combining a component indicated by the broken line (indicative of an ideal case) in FIG. 13 and linearly increasing with respect to the pulse width, with the offset charge (indicated by A). Note that each input pulse width of the second sub charge pump is set at a predetermined value, and that the second sub charge pump performs its discharging operation while the first sub charge pump performs its charging operation, and performs its charging operation while the first sub charge pump performs its discharging operation. Therefore, if transistors of an appropriate size and appropriate pulse widths are employed in the second sub charge pump, the offset charge (indicated by A) can substantially be canceled at both the charging and discharging times, thereby making the relationship between the input pulse width and the total charge approach an ideal one indicated by the broken line of FIG. 13. As a result, the dependency of the average current upon the pulse width at the charging and discharging times can be significantly reduced. In other words, the dependency can be made to approach an ideal one as indicated by the broken line (the ideal case) in FIG. 13.

Figure 14:
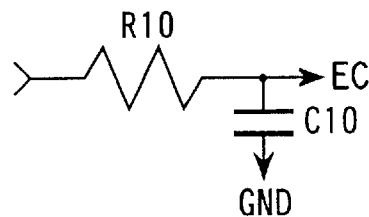
FIG. 14 is a circuit diagram, showing a low pass filter employed in the PLL of FIG. 5.

Referring then to FIG. 14, the low pass filter (LPF) 20 incorporated in the PLL 14 of FIG. 5 will be described.

FIG. 14 is a circuit diagram, showing the structure of the low pass filter 20 in the PLL 14.

As is shown in FIG. 14, the low pass filter 20 comprises a resistor R10 and a capacitor C10. The low pass filter 20 performs removal of the switching noise of the charge pump 18 or integration of the phase difference between the clock signals CLKB and CLKD, i.e. performs charge/discharge of electricity corresponding to the phase difference between the two clock signals. Then, the low pass filter 20 outputs a control voltage EC for controlling the oscillation frequency of the voltage controlled oscillator 22.

The capacitance of the capacitor C10 greatly influences the stability of the PLL system. The greater the capacitance, the more stable the PLL system. However, if the capacitance is too great, the time (lockup time) required until the clock signal CLKD is synchronized with the clock signal CLKB will increase, or the area for forming the capacitor C10 will increase.

Figure 15:
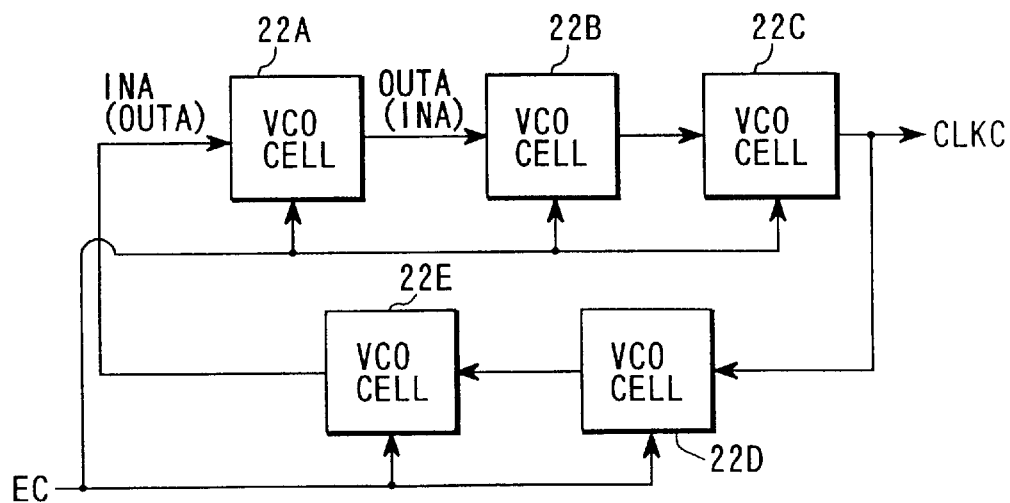
FIG. 15 is a block diagram, showing a voltage controlled oscillator employed in the PLL of FIG. 5.

Referring now to FIGS. 15 and 16, the voltage controlled oscillator (VCO) 22 incorporated in the PLL 14 will be described.

FIG. 15 is a block diagram, showing the structure of the voltage controlled oscillator 22 in the PLL 14.

FIG. 16 is a circuit diagram, showing the structure of a VCO cell included in the oscillator 22.

As is shown in FIG. 15, the voltage controlled oscillator 22 has a plurality (five in the figure) of VCO cells 22A–22E connected in the form of a ring. A control voltage EC is input to each VCO cell for controlling the oscillation frequency.

As is shown in FIG. 16, each VCO cell includes pMOS transistors P11–P13 and nMOS transistors N11–N13. An INA signal, which is the output of an inverter incorporated in a previous-stage VCO cell, is input to the gate of an inverter constituted of the pMOS transistor P13 and nMOS transistor N13. An OUTA signal, which is the output of the inverter, is input to the gate of an inverter in the next-stage VCO cell.

In the voltage controlled oscillator 22 constructed as above, the control voltage EC output from the low pass filter 20 controls the oscillation frequency of the oscillator. When the control voltage EC increases, the frequency of the clock signal CLKC output from the oscillator 22 increases. When, on the other hand, the control voltage EC decreases, the frequency of the clock signal CLKC output from the oscillator 22 decreases.

The delay circuit 24 incorporated in the PLL 14 of FIG. 5 will now be described. The delay circuit 24 is interposed between the voltage controlled oscillator 22 and the phase frequency detector 16. The delay circuit 24 delays the input clock signal CLKC by the delay time TA corresponding to the delay time of the clock buffer 12. Then, a clock signal CLKD delayed by the delay time TA with respect to the clock signal CLKC is output to the phase frequency detector 16.

As described above, even if in the charge pump of FIG. 8, the pulse width of each driving signal is small, substantial canceling of the charges of junction capacitors existing at PN junctions (accumulated charges of the junction capacitors C1 and C2) can minimize the influence of charge/discharge by the junction capacitors C1 and C2 to thereby suppress an increase in the average current while the charge pump performs charging and discharging operations, and hence to reduce the dependency of the effective average current upon the pulse width.

Moreover, since in the PLL of FIG. 5 using the charge pump, an increase in the effective average current can be suppressed while the charge pump performs charging and discharging operations, it is not necessary to increase the capacitance of the capacitor incorporated in the low pass filter, which means that the lockup time or the area required for the filter will not increase.

In the semiconductor storage device of FIG. 4 using the PLL, a delay in the clock signal CLKB for synchronization delayed by the clock buffer 12 is eliminated by the PLL 14, thereby creating a phase-adjusted clock signal CLKC for synchronization.

A charge pump according to another embodiment of the invention will be described. The PLL using this charge pump has a similar structure to the PLL of FIG. 5. The semiconductor storage device using the PLL with this charge pump has a similar structure to the semiconductor storage device of FIG. 4.

FIG. 17 is a circuit diagram, showing the structure of the charge pump according to another embodiment.

This charge pump comprises a first charge pump (hereinafter referred to as a "first sub charge pump") and a second charge pump (hereinafter referred to as a "second sub charge pump").

The first sub charge pump is constructed as below. As is shown in FIG. 17, a pMOS transistor P1 has its source connected to a power voltage VDD, and its drain connected to the source of a pMOS transistor P2. The drain of the pMOS transistor P2 is connected to the source of a pMOS transistor P3, and the drain of the pMOS transistor P3 to a low pass filter (LPF) 20.

The drain of the pMOS transistor P3 is connected to the drain of an nMOS transistor N1, and the source of the nMOS transistor N1 to the drain of an nMOS transistor N2. The source of the nMOS transistor N2 is connected to the drain of an nMOS transistor N3, and the source of the nMOS transistor N3 to a reference voltage source (GND).

Moreover, PN junctions exist between the drain of the pMOS transistor P1 and the source of the pMOS transistor P2, and between the source of the nMOS transistor N2 and the drain of the nMOS transistor N3, and junction capacitors C1 and C2 are formed at the PN junctions, respectively.

A pMOS transistor P4 has a source connected to the VDD, a gate connected to the gate of the pMOS transistor P1, and a drain connected to the drain of an nMOS transistor N4. The gate and drain of the pMOS transistor P4 are connected to each other, and the source of the nMOS transistor N4 to the reference voltage source.

In addition, an UP signal for controlling the charging operation of the charge pump is input to the gate of the pMOS transistor P2. An enable bar signal which is the inverted signal of an enable signal is input to the gate of the pMOS transistor P3. Furthermore, the enable signal is input to the gate of the nMOS transistor N1, a DOWN signal for controlling the discharging operation of the charge pump to the gate of the nMOS transistor N2, and a Vref signal to the gate of the nMOS transistor N3.

The second sub charge pump is constructed as below. A p-channel MOS transistor P5 has its source connected to the power voltage VDD, and its drain connected to the source of a pMOS transistor P6. The drain of the pMOS transistor P6 is connected to the source of a pMOS transistor P7, and the drain of the pMOS transistor P7 to a low pass filter (LPF) 20.

The drain of the pMOS transistor P7 is connected to the drain of an n-channel MOS transistor N5, and the source of the nMOS transistor N5 to the drain of an nMOS transistor N6. The source of the nMOS transistor N6 is connected to the drain of an nMOS transistor N7, and the source of the nMOS transistor N7 to the reference voltage source (GND).

Moreover, PN junctions exist between the drain of the pMOS transistor P5 and the source of the pMOS transistor P6, and between the source of the nMOS transistor N6 and the drain of the nMOS transistor N7, and junction capacitors C3 and C4 are formed at the PN junctions, respectively.

The gate of the pMOS transistor P5 is connected to the gate of the pMOS transistor P4. The UP signal for controlling the charging operation of the charge pump is input to the gate of the pMOS transistor P6. The enable bar signal which is the inverted signal of the enable signal is input to the gate of the pMOS transistor P7. Furthermore, the enable signal is input to the gate of the nMOS transistor N5, the PDOWN signal for controlling the discharging operation of the charge pump to the gate of the nMOS transistor N6, and the Vref signal to the gate of the nMOS transistor N7.

The operation of the above-described charge pump 18 will be described.

In the first sub charge pump, the pMOS transistor P2 is driven and turned on by an UP signal as shown in FIG. 18. As a result, the first sub charge pump charges the low pass filter 20 with electricity corresponding to the pulse width of the UP signal. Further, in the first sub charge pump, the nMOS transistor N2 is driven and turned on by a DOWN signal as shown in FIG. 19. As a result, the first sub charge pump discharges, from the low pass filter 20, electricity corresponding to the pulse width of the DOWN signal.

The relationship between the total charge and each pulse width is controlled by the size of the current limiting transistor P1 or N3 located at the source-side of the pMOS transistor P2 or the nMOS transistor N2, or by the gate voltage (Vref) applied to the limiter transistor N3 and the nMOS transistor N4.

Also, the output-side pMOS transistor P3. and nMOS transistor N1 are controlled by the enable bar signal and the enable signal, respectively, and serve as filters for interrupting a pass current while the charge pump is in the stand-by state, and eliminating switching noise while the charge pump operates.

On the other hand, when the first sub charge pump has been driven by the UP signal, the pMOS transistor P6 incorporated in the second sub charge pump is driven and turned on by a PUP signal as shown in FIG. 18, which uses the leading edge of the UP signal as a trigger and has a pulse width smaller by a predetermined width (td) than the UP signal. As a result, the second sub charge pump charges the low pass filter 20 with electricity corresponding to the pulse width of the PUP signal.

Further, when the first sub charge pump has been driven by the DOWN signal, the nMOS transistor N6 incorporated in the second sub charge pump is driven and turned on by a PDOWN signal as shown in FIG. 19, which uses the leading edge of the DOWN signal as a trigger and has a pulse width smaller by a predetermined width (td) than the DOWN signal. As a result, the second sub charge pump discharges from the low pass filter 20 electricity corresponding to the pulse width of the PDOWN signal.

When the charge pump 18 has started its charging or discharging operation, the potential of the drain of the limiter transistor P1 or N3 becomes its operable level after the junction capacitor C1 or C2 is discharged or charged, respectively. Thus, the limiter transistor P1 or N3 is turned on to thereby limit the current. Accordingly, immediately after the start of the charging or discharging operation by the charge pump 18, the limiter transistor P1 or N3 does not work, and hence the electricity accumulated in the junction capacitor C1 or the electricity to be accumulated into the junction capacitor C2 is added to the electricity to be applied to or discharged from the low pass filter 20. The electricity accumulated in the junction capacitor C1 or the electricity to be accumulated into the junction capacitor C2 is called an "offset charge" as in the first-described embodiment.

The junction capacitor exists where a PN junction exists. Accordingly, in this charge pump 18, during charging, the first sub charge pump performs its charging operation in response to the UP signal, while the second sub charge pump performs its charging operation in response to the PUP signal which has the pulse width smaller by the predetermined width than the pulse width of the UP signal, in order to eliminate the influence of the offset charge. During discharging, the first sub charge pump performs its discharging operation in response to the DOWN signal, while the second sub charge pump performs its discharging operation in response to the PDOWN signal which has the pulse width smaller by the predetermined width than the pulse width of the DOWN signal, in order to eliminate the influence of the offset charge.

In the second sub charge pump, the relationship between the total charge and the pulse widths is controlled by the size of the current limiting transistor P5 or N7 located at the source-side of the pMOS transistor P6 or the nMOS transistor N6, or by the gate voltage (Vref) applied to the limiter transistor N7 and the nMOS transistor N4.

Also, the output-side pMOS transistor P7 and nMOS transistor N5 are controlled by the enable bar signal and the enable signal, respectively, and serve as filters for interrupting a pass current while the charge pump is in the stand-by state, and eliminating switching noise while the charge pump operates.

In summary, while the charge pump 18 performs a charging operation, the first and second sub charge pumps are substantially simultaneously driven by the UP and PUP signals shown in FIG. 18. Then, in the first sub charge pump, electricity accumulated in the junction capacitor C1 flows into the low pass filter 20 to thereby charge it with electricity corresponding to the pulse width of the UP signal. On the other hand, the second sub charge pump starts its charging operation by the PUP signal which has the pulse width smaller by the predetermined width (td) than the UP signal. Specifically, the flow of the electricity accumulated in the junction capacitor C3 into the low pass filter 20 is started by the PUP signal, thereby charging the filter 20 with electricity corresponding to the pulse width of the PUP signal. As a result, in the charge pump 18, the difference between the maximum and minimum values of the average current at the start of the charging operation of the charge pump can be reduced. The predetermined width (td) is set at a value which enables reduction of the difference between the maximum and minimum values of the average current at the start of the charging operation of the charge pump.

On the other hand, when the charge pump performs a discharging operation, the first and second sub charge pumps are substantially simultaneously driven by the DOWN and PDOWN signals shown in FIG. 19. In the first sub charge pump, discharge of the electricity in the low pass filter 20 is started by the DOWN signal to charge the junction capacitor C2. That is, electricity corresponding to the pulse width of the DOWN signal is discharged from the low pass filter 20. The second sub charge pump starts its discharging operation by the PDOWN signal which has the pulse width smaller by the predetermined width (td) than the DOWN signal. Specifically, discharge of electricity from the low pass filter 20 is started by the PDOWN signal to thereby charge the junction capacitor C4, thereby discharging from the filter 20 electricity corresponding to the pulse width of the PDOWN signal. As a result, in the charge pump 18, the difference between the maximum and minimum values of the average current at the start of the discharging operation of the charge pump can be reduced. The predetermined width (td) is set at a value which enables reduction of the difference between the maximum and minimum values of the average current at the start of the discharging operation of the charge pump. If the pulse. width of the UP or DOWN signal is smaller than the predetermined width (td), the pulse width of the PUP or PDOWN signal is set at 0.

Figure 21:
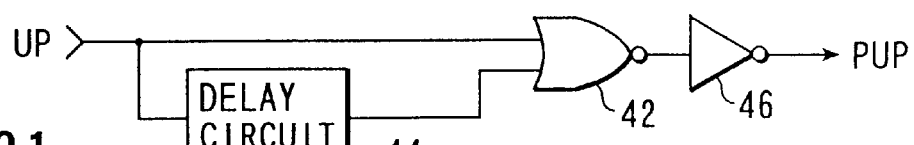
FIG. 21 is a circuit diagram, showing a circuit for generating the driving waveform of FIG. 18.

A circuit as shown in FIG. 21 can be used as one for generating the PUP signal from the UP signal. In the FIG. 21 circuit, the UP signal is input to the first terminal of a NOR gate circuit 42. The UP signal is also delayed by a delay circuit 44 by the time period td, and then input to the second terminal of the NOR gate circuit 42. The NOR gate circuit 42 produces the alteration of the signals input to its first and second terminals, and inverts the alteration. The inverted alteration is again inverted by an inverter 46, thereby generating the PUP signal shown in FIG. 18.

Figure 22:
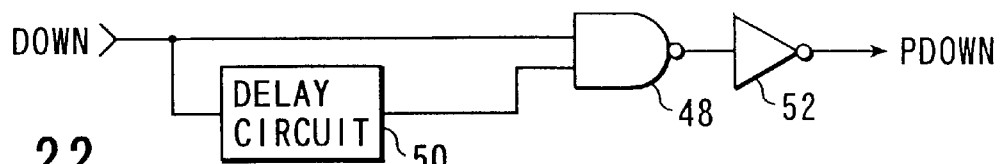
FIG. 22 is a circuit diagram, showing a circuit for generating the driving waveform of FIG. 19.

A circuit as shown in FIG. 22 is used as one for generating the PDOWN signal from the DOWN signal. In the FIG. 22 circuit, the DOWN signal is input to the first terminal of a NAND gate circuit 48. The DOWN signal is also delayed by a delay circuit 50 by the time period td, and then input to the second terminal of the NAND gate circuit 48. The NAND gate circuit 48 produces the logical product of the signals input to its first and second terminals, and inverts the logical product. The inverted logical product is again inverted by an inverter 52, thereby generating the PDOWN signal shown in FIG. 19.

The relationship between the pulse width of each driving signal and the output or input average current in the first sub charge pump is indicated by broken line (sub-CHP1) in FIG. 20 for the reason stated below.

As described above, a great amount of current flows from the junction capacitor C1 on the drain-side of the limiter transistor P1, or flows into the junction capacitor C2 on the drain-side of the limiter transistor N3 until a predetermined time period elapses after the start of operation of the first sub charge pump. At this time, the limiter transistors P1 and N3 do not work, and hence do not limit the charging/discharging current. After the predetermined time period elapses, discharge of the capacitor C1 or charge of the capacitor C2 is finished, and the potential of the contact between the transistors P1 and P2 or N2 and N3 decreases or increased to the operable level of the limiter transistor P1 or N3. As a result, the limiter transistor P1 or N3 starts to operate to thereby limit the current to a predetermined average value.

On the other hand, the relationship between the pulse width of each driving signal and the average current in the second sub charge pump is indicated by broken line (sub-CHP2) in FIG. 20 for the reason stated below. As in the case of the first sub charge pump, a great amount of current flows from the junction capacitor C3 on the drain-side of the limiter transistor P5, or flows into the junction capacitor C4 on the drain-side of the limiter transistor N7 until a predetermined time period elapses after the start of operation of the second sub charge pump. At this time, the limiter transistors P5 and N7 do not work, and hence do not limit the charging/discharging. current. After the predetermined time period elapses, discharge of the capacitor C3 or charge of the capacitor C4 is finished, and the potential of the contact between the transistors P5 and P6 or N7 and N6 decreases or increased to the operable level of the limiter transistor P5 or N7. As a result, the limiter transistor P5 or N7 starts to operate to limit the current to a predetermined average value. The relationship between the pulse width and the average current of the entire charge pump is expressed by the solid line in FIG. 20 which is obtained by combining broken line (sub-CHP1) with broken line (sub-CHP2).

Figure 20:
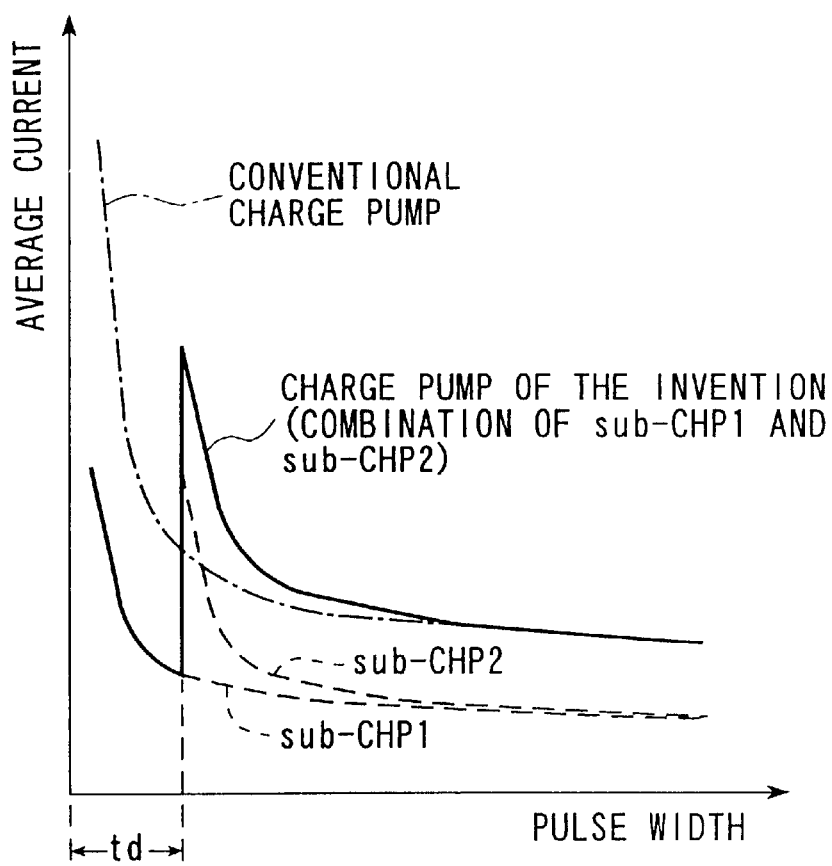
FIG. 20 a graph, illustrating the relationship between the pulse width of a driving signal and an average current in the charge pump of FIG. 17.

On the other hand, the relationship between the pulse width and the average current of the conventional charge pump which consists of only one charge pump is expressed by the one-dot chain line in FIG. 20. It is evident from FIG. 20 that the maximum value of the average current of the charge pump of the invention, which is assumed when the pulse width is small (0<pulse width<td), is lower than the conventional average current.

As described above, the charge pump according to another embodiment of the invention is constituted of the first and second sub charge pumps. During charging, the first sub charge pump performs its charging operation in response to a driving signal of a first pulse width, while the second sub charge pump performs its charging operation in response to a driving signal of a pulse width which is smaller than the first pulse width by a predetermined width. During discharging, the first sub charge pump performs its discharging operation in response to a driving signal of a second pulse width, while the second sub charge pump performs its discharging operation in response to a driving signal of a pulse width which is smaller than the second pulse width by a predetermined width.

In other words, in the charge pump shown in FIG. 17, the second sub charge pump performs its charging operation for a time period shorter by a predetermined period than the charging time period of the first sub charge pump, while the second sub charge pump performs its discharging operation for a time period shorter by a predetermined period than the discharging time period of the first sub charge pump. As a result, even if the pulse width of the driving signal is small, the influence of the total charge of junction capacitors existing at PN junctions can be reduced, thereby suppressing variations in average current during charging and discharging of the charge pump, and reducing the dependency of the effective average current upon the pulse width.

Although in the first-mentioned embodiment, a driving signal of a predetermined pulse width for driving the second sub charge pump is generated using, as a trigger, the leading edge of the driving signal for driving the first sub charge pump, the former signal may be generated using the trailing edge or both edges of the latter signal as a trigger. In addition, although in the another embodiment, a driving signal for driving the second sub charge pump, which has a predetermined pulse width smaller by a predetermined time period, is generated using, as a trigger, the leading edge of the driving signal for driving the first sub charge pump, the former signal may be generated using the trailing edge or both edges of the latter signal as a trigger.

Furthermore, although in the above-described embodiments, the charge pump consists of two (first and second) sub charge pumps, the number of sub charge pumps is not limited to two, but may be three or more.

Since the PLL of FIG. 5 employed in the charge pump of FIG. 17 can suppress an increase in the effective average current during charging and discharging of the charge pump, it is not necessary to increase the capacitance of the capacitor used in the low pass filter, which means that an increase in lockup time or layout area can be minimized.

In addition, in the semiconductor storage device of FIG. 4 using the PLL, a delay in the clock signal CLKB for synchronization delayed by the clock buffer 12 is eliminated by the PLL 14 incorporated in the semiconductor storage device, thereby forming a phase-adjusted clock signal CLKC for synchronization.

As described above, the invention can provide a charge pump capable of reducing the influence of the total charge of junction capacitors existing at PN junctions even if the pulse width of a driving signal used therein is small, thereby suppressing variations in average current during charging and discharging of the charge pump, and reducing the dependency of the effective average current upon the pulse width.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charge pump comprising:
   a first sub charge pump having a plurality of transistors for performing charging and discharging operations; and
   a second sub charge pump having a charging/discharging terminal common to that of the first sub charge pump, the second sub charge pump discharging electricity which is charged via the charging/discharging terminal when the first sub charge pump has performed a charging operation using electricity accumulated in a junction capacitor at a PN junction which exists between the transistors of the fist sub charge pump, the second sub charge pump charging electricity via the charging/discharging terminal when the first sub charge pump has performed a discharging operation to charge the junction capacitor;

wherein the first sub charge pump performs the charging or discharging operation set by a signal of a pulse width corresponding to a first time period longer than a second time period for which electricity is charged into or discharged from the junction capacitor, while the second sub charge pump performs a charging or discharging operation set by a signal of a pulse width corresponding to the second time period for which electricity is charged into or discharged from the junction capacitor.

2. The charge pump according to claim 1, wherein a leading edge of a pulse signal for driving the first sub charge pump is used as a trigger to stat the operation of the second sub charge pump.

3. A charge pump comprising:

a first sub charge pump having a plurality of transistors for performing charging and discharging operations; and a second sub charge pump having a charging/discharging terminal common to that of the first sub charge pump, the second sub charge pump performing a charging operating for a time period shorter by a predetermined time period than a charging time period for which the first sub charge pump performs a charging operation, the second sub charge pump performing a discharging operation for the time period shorter by a predetermined time period than a discharging time period for which the first sub charge pump performs a discharging operation.

4. The charge pump according to claim 3, wherein the predetermined time period is set such that the dependency of an average current to be charged or discharged by the first and second sub charge pumps upon the charging or discharging time period for which the first and second sub charge pumps perform the charging and discharging operation is minimized.

5. The charge pump according to claim 3, wherein a leading edge of a pulse signal for driving the first sub charge pump is used to generate a pulse signal for driving the second sub charge pump.

6. A charge pump comprising:

a first sub charge pump having a plurality of transistors for performing a charging operation in response to a charging signal and a discharging operation in response to a discharging signal; and a second sub charge pump having a charging/discharging terminal common to that of the first sub charge pump, the second sub charge pump performing a discharging operation in response to a pulse signal generated from the charging signal, when the first sub charge pump has performed a charging operation in response to the charging signal using electricity accumulated in a junction capacitor at a PN junction which exists between the transistors of the first sub charge pump, the second sub charge pump performing a charging operation in response to a pulse signal generated from the discharging signal, when the first sub charge pump has performed a discharging operation in response to the discharging signal to charge the junction capacitor;

wherein the first sub charge pump performs the charging or discharging operation set by a signal of a pulse width corresponding to a first time period longer than a second time period for which electricity is charged into or discharged from the junction capacitor, while the second sub charge pump performs a charging or discharging operation set by a signal of a pulse width corresponding to the second time period for which electricity is charged into or discharged from the junction capacitor.

7. The charge pump according to claim 6, wherein a leading edge of the charging or discharging signal for driving the first sub charge pump is used as a trigger to start the operation of the second sub charge pump.

8. A charge pump comprising:

a first sub charge pump having a plurality of transistors for performing a charging operation in response to a charging signal of a first pulse width, and performing a discharging operation in response to a discharging signal of a second pulse width; and a second sub charge pump having a charging/discharging terminal common to that of the first sub charge pump, the second sub charge pump performing a charging operation in response to a pulse signal of a third pulse width shorter by a predetermined width than the first pulse width when the first sub charge pump performs the charging operation in response to the charging signal of the first pulse width, the second sub charge pump performing a discharging operation in response to a pulse signal of a fourth pulse width shorter by a predetermined width than the second pulse width when the first sub charge pump performs the charging operation in response to the charging signal of the second pulse width.

9. The charge pump according to claim 8, wherein the predetermined width is set such that the dependency of an average current to be charged or discharged by the first and second sub charge pumps upon a charging or discharging time period for which the first and second sub charge pumps perform the charging or discharging operation is minimized.

10. The charge pumps according to claim 8, wherein a leading edge of the charging or discharging signal for driving the first sub charge pump is used to generate the pulse signal for driving the second sub charge pump.

11. A charge pump comprising:

a first sub charge pump having a charging section wherein the source of a first p-channel MOS transistor is connected to the drain of a second p-channel MOS transistor, the drain of the first p-channel MOS transistor is connected to the source of a third p-channel MOS transistor, the source of the second p-channel MOS transistor is connected to a power voltage, and the drain of the third p-channel MOS transistor is connected to a charging/discharging terminal, the first sub charge pump also having a discharge section wherein the drain of a first n-chancel MOS transistor is connected to the source of a second n-channel MOS transistor, the drain of the second n-channel MOS transistor is connected to the source of a third n-chancel MOS transistor, the source of the first n-channel MOS transistor is connected to a ground voltage, and the drain of the third n-channel MOS transistor is connected to the charging/discharging terminal; and a second sub charge pump having a charging section wherein the source of a fourth p-channel MOS transistor is connected to the drain of a fifth p-channel MOS transistor, the drain of the fourth p-channel MOS transistor is connected to the source of a sixth p-channel MOS transistor, the source of the fifth p-channel MOS transistor is connected to the power voltage, and the drain of the sixth p-channel MOS transistor is connected to the charging/discharging terminal, the second sub charge pump also having a discharging section wherein the drain of a fourth n-channel MOS transistor is connected to the source of a fifth n-channel MOS transistor, the drain of the fifth n-channel MOS transistor is connected to the source of a sixth n-channel MOS transistor, the source of the fourth n-channel MOS transistor is connected to the ground voltage, and the drain of the sixth n-channel MOS transistor is connected to the charging/ discharging terminal;

wherein the first sub charge pump performs a charging operation set by a signal of a pulse width corresponding to a first time period longer than a second time period for which electricity is discharged from a first junction capacitor at a PN junction which exists between the first p-channel MOS transistor and the second p-channel MOS transistor, while the second sub charge pump performs a discharging operation set by a signal of a pulse width corresponding to the second time period for which electricity is discharged from the first junction capacitor, and the first sub charge pump performs a discharging operation set by a signal of a pulse width corresponding to a third time period longer than a fourth time period for which electricity is charged into a second junction capacitor at a PN junction which exists between the first n-channel MOS transistor and the second n-chancel MOS transistor, while the second sub charge pump performs a charging operation set by a signal of a pulse width corresponding to the fourth time period for which electricity is charged into the second junction capacitor.

12. The charge pump according to claim 11, wherein a leading edge of a pulse signal for driving the first sub charge pump is used as a trigger to start the operation of the second sub charge pump.

13. The charge pump according to claim 11, wherein a leading edge of a pulse signal for driving the first sub charge is used to generate a pulse signal for driving the second sub charge pump.

\* \* \* \* \*